US009593995B2

(12) United States Patent
Wagner et al.

(10) Patent No.: US 9,593,995 B2
(45) Date of Patent: Mar. 14, 2017

(54) PACKAGE FOR A DIFFERENTIAL PRESSURE SENSING DIE

(71) Applicant: Measurement Specialties, Inc., Hampton, VA (US)

(72) Inventors: David E. Wagner, Los Gatos, CA (US); John J. Valentini, Pleasanton, CA (US)

(73) Assignee: Measurement Specialties, Inc., Hampton, VA (US)

( * ) Notice: Subject to any disclaimer, the term of this patent is extended or adjusted under 35 U.S.C. 154(b) by 133 days.

(21) Appl. No.: 14/194,030

(22) Filed: Feb. 28, 2014

(65) Prior Publication Data

US 2015/0247776 A1    Sep. 3, 2015

(51) Int. Cl.
*G01L 19/14*    (2006.01)
*G01L 19/00*    (2006.01)
(Continued)

(52) U.S. Cl.
CPC ........ *G01L 19/0069* (2013.01); *G01L 9/0054* (2013.01); *G01L 13/025* (2013.01);
(Continued)

(58) Field of Classification Search
CPC ..... G01L 19/14; G01L 9/0054; G01L 13/025; G01L 19/0069; G01L 19/142;
(Continued)

(56) References Cited

U.S. PATENT DOCUMENTS 3,875,802 A * 4/1975 Garnett ............... G01F 1/38
73/720
3,938,175 A * 2/1976 Jaffe .................. G01L 9/0054
257/418
(Continued)

FOREIGN PATENT DOCUMENTS

DE     10231010 A1 * 1/2004  ......... G01L 19/0046

OTHER PUBLICATIONS

International Search Report for counterpart International Patent Application No. PCT/US2015/18091 mailed Jun. 3, 2015.

*Primary Examiner* — Michael A Lyons
*Assistant Examiner* — David L Singer
(74) *Attorney, Agent, or Firm* — Howard IP Law Group, P.C.

(57) ABSTRACT

A differential pressure sensor includes a pressure sensing die comprising a semiconductor die, having a thinned portion forming a diaphragm. The diaphragm includes piezo-resistive elements that exhibit varying resistance based on force exerted on the diaphragm. A first support structure is bonded to a first surface of the semiconductor die, having an aperture defined through the support structure such that a first surface of the diaphragm is exposed through the aperture. A second support structure is bonded to the opposite side of the semiconductor die having an aperture aligned with the opposing side of the diaphragm. Electrical components in electrical communication with the piezo-resistive elements are arranged outside the region defined by the bond between the first and second support structures and the (Continued)

semiconductor die. An oil-filled volume may be defined between the semiconductor die and a harsh medium which transmits a fluid pressure to the die without the harsh medium contacting the die.

21 Claims, 12 Drawing Sheets

(51) Int. Cl.
    *G01L 13/02*         (2006.01)
    *G01L 9/00*          (2006.01)
    *G01L 19/06*         (2006.01)

(52) U.S. Cl.
    CPC ...... *G01L 19/0084* (2013.01); *G01L 19/0645* (2013.01); *G01L 19/142* (2013.01); *G01L 19/143* (2013.01); *G01L 19/147* (2013.01)

(58) Field of Classification Search
    CPC .............. G01L 19/143; G01L 19/0627; G01L 19/0046; G01L 19/0645; G01L 19/0084; G01L 19/144; G01L 19/147; G01L 19/0042; G01L 19/0072; G01L 9/0042; G01L 9/0052; G01L 9/0072; G01F 1/34; G01F 1/38
    USPC .................... 73/431, 721, 706, 716; 324/691
    See application file for complete search history.

(56) References Cited

U.S. PATENT DOCUMENTS

| | | | |
|---|---|---|---|
| 4,135,408 A * | 1/1979 | Di Giovanni | G01L 13/025 338/4 |
| 4,140,023 A * | 2/1979 | Edwards | G01L 9/0055 73/721 |
| 4,257,274 A * | 3/1981 | Shimada | G01L 9/0042 361/283.4 |
| 4,388,833 A * | 6/1983 | Kuwayama | G01L 9/0038 361/283.3 |
| 4,411,158 A * | 10/1983 | Schaff, Jr. | G01L 9/0054 338/4 |
| 4,572,551 A * | 2/1986 | Jaquette | F16L 19/0212 285/108 |
| 4,773,269 A | 9/1988 | Knecht et al. | |
| 4,878,385 A | 11/1989 | Lloyd | |
| 4,879,903 A * | 11/1989 | Ramsey | G01L 19/0084 29/621.1 |
| 5,110,160 A * | 5/1992 | Brozovic | F16L 15/008 285/211 |
| 5,537,860 A | 7/1996 | Haertl | |
| 5,602,373 A * | 2/1997 | Sauer | G01L 13/025 116/267 |
| 5,623,102 A * | 4/1997 | Arndt | G01L 9/0042 29/25.41 |
| 6,229,190 B1 * | 5/2001 | Bryzek | G01L 9/0042 257/254 |
| 6,295,875 B1 * | 10/2001 | Frick | G01L 9/0072 73/718 |
| 6,311,561 B1 | 11/2001 | Bang et al. | |
| 6,543,291 B1 * | 4/2003 | Kurtz | G01L 13/025 73/716 |
| 6,550,337 B1 | 4/2003 | Wagner et al. | |
| 7,644,625 B2 | 1/2010 | Ricks | |
| 7,713,771 B2 | 5/2010 | Eriksen et al. | |
| 8,026,121 B2 | 9/2011 | Krog et al. | |
| 8,171,800 B1 | 5/2012 | Chiou | |
| 8,466,523 B2 | 6/2013 | Chiou | |
| 2002/0029639 A1 | 3/2002 | Wagner et al. | |
| 2006/0278005 A1 | 12/2006 | Broden et al. | |
| 2009/0293628 A1 * | 12/2009 | Brown | G01L 9/0055 73/723 |
| 2010/0122583 A1 | 5/2010 | Rozgo et al. | |
| 2010/0206046 A1 * | 8/2010 | Bentley | G01L 19/0023 73/29.02 |
| 2011/0005326 A1 * | 1/2011 | Bentley | G01L 19/148 73/754 |
| 2011/0036174 A1 * | 2/2011 | Hooper | B81B 7/0061 73/721 |
| 2011/0132085 A1 * | 6/2011 | Chiou | G01L 19/0609 73/431 |
| 2013/0047737 A1 * | 2/2013 | Vagle | G01L 19/0645 73/716 |
| 2013/0233085 A1 * | 9/2013 | Mizoguti | G01L 7/022 73/716 |
| 2014/0144243 A1 * | 5/2014 | Tanaka | G01L 13/025 73/716 |

* cited by examiner

PACKAGE FOR A DIFFERENTIAL PRESSURE SENSING DIE

FIELD OF THE INVENTION

The application relates to sensors. More particularly, the application relates to sensors for detecting differential pressures of fluids and gasses.

BACKGROUND OF THE INVENTION

Differential pressure sensors measure a difference in pressure between two isolated fluids or gasses. When used in an environment which includes conductive or corrosive gasses or fluids, the sensor must be isolated from these harsh media in order to protect the sensor itself, as well as the electronic or electrical components attached to the sensor. Differential pressure sensors are harder to isolate from harsh media than gage or absolute pressure sensors due to the two pressure sources being applied to opposing sides of the sensor. Therefore, both sides of the sensor must be isolated in some way or the electronic-pressure sensor device may be damaged.

A differential pressure sensor (or transducer) converts a difference in pressure to an electrical signal that can be measured to determine the differential pressure value. A pressure-sensing device is typically manufactured using micro-machined or Micro-Electro-Mechanical System (MEMS) type methods. This technology is used to manufacture commercial semiconductors along with etching and bonding techniques to fabricate very small, inexpensive devices that convert differential pressure to an electrical signal. The materials used in these devices do not resist corrosion as well as other well known corrosive resistant metals such as stainless steel, titanium, copper and brass, which are typically used in corrosive fluid and gas plumbing. For this reason, an isolation method is required to act as a barrier for corrosion but allow pressure to be communicated to the pressure sensing device without substantially degrading the signal.

The pressure-sensing die is formed from a semiconductor material such as silicon. FIG. 1 is a sectional view of a MEMS type pressure sensing die 100 of the prior art. The die 100 is formed from a silicon wafer by methods such as dicing to produce a silicon structure 101. The structure 101 is thinned to create a cavity 105 and a thinned portion defining a diaphragm 103. The semiconductor structure 101 may be thinned by any suitable means, for example, the structure 101 may be thinned using anisotropic etching as known in the art. Resistive elements are formed on the surface of the diaphragm 103. The resistive elements exhibit resistance that is proportional to the strain placed on the thinned semiconductor material forming the diaphragm 103.

FIG. 2 is an illustration of a prior art MEMS pressure sensor designed as a gage or absolute pressure measurement device using pressure sensing die 100. Pressure sensing device 100 is typically mounted to a support structure 207 which is, in turn bonded to a base plate 201, formed from a non-corroding material, for example, stainless steel. The sensing die 100 and the support structure 207 may be bonded to base plate 201, which may also be termed a header, by an adhesive 205. The support structure 207 is used as it isolates the pressure sensing device 100 from sources of strain that are unrelated to pressure, such as thermal expansion which varies between the pressure sensing device 100 and the base plate 201. An opening 203 is defined in the base plate 201 defining an aperture which is in fluid communication with the underside of the diaphragm of pressure sensing device 100. The opening 203 allows ambient pressure to come in contact with one side of the pressure sensing device 100 providing a reference pressure. The reference pressure may used in measuring the pressure of a fluid under test which exerts pressure on the opposite side of the pressure sensing die 100. The pressure sensing die 100 is attached to the base plate 201 over the opening 203 via support structure 207. Support structure 207 may be formed from glass or similar material which has a coefficient of thermal expansion closer to that of the silicon pressure sensing die 100 as compared to the coefficient of thermal expansion of the stainless steel making up the base plate 201. This matching of the coefficients of thermal expansion prevents exertion of forces on the die 100 not related to pressure, but rather, caused by the strain related to the dissimilar rates of expansion between the die 100 and the base plate 201. The constraint 207 is attached to the base plate 201 by an appropriate adhesive 205 as known in the art. For example, bonding may be performed by a Silicone adhesive, epoxy, solder, braze or other commonly known techniques.

The pressure sensing device 200 includes upper housing 223. Upper housing 223 is configured to provide a sealed attachment to base plate 201. An enclosed volume is defined between upper housing 223 and base plate 201. Flexible corrugated diaphragm 221 serves to divide the enclosed volume into a first volume 219 and a second volume 227. Port 225 is defined through a wall of upper housing 223 and in communication with first volume 219. Port 225 may be coupled to a fluid source which is to be tested for pressure. Pressure sensing die 100 further includes electrical components which create and transmit an electrical signal indicative of a pressure exerted on the die 100. In applications where the fluid being tested is a harsh medium, such as fuel or oil, such media may corrode the electrical components of the die 100. Therefore, care must be taken to isolate the die 100 from the fluid being tested. Isolation is accomplished by flexible corrugated diaphragm 221. An oil fill port 215 is provided through the base plate 201. The oil fill port allows the volume 219 between the die 100 and the diaphragm 221 to be filled with a non-corrosive fluid such as silicone oil. When the cavity defining volume 219 is filled, the oil fill port 215 is sealed, for example, by welding a ball 217 across the opening of the oil fill port 215. The oil in volume 219 is thus fully enclosed and in fluid communication with the upper surface of die 100.

Port 225 may be threaded to allow the pressure sensing device 200 to be attached to a line or other transmission means in fluid communication with the fluid to be tested or measured. The fluid being measured enters the port 225 and fills the interior volume 227. When the interior volume 227 is filled, the fluid being measured is in contact with the upper side of the flexible diaphragm 221. Pressure exerted by the fluid being measured is transmitted through the flexible diaphragm 221 to the enclosed volume 219 of oil. The force applied to the oil by the flexible diaphragm 221 is transmitted throughout the oil and to the surfaces containing the oil, including the upper surface of pressure sensing die 100.

When a force is exerted on pressure sensing die 100, an electrical signal through piezo-resistive elements formed in the upper surface of the diaphragm of pressure sensing die 100 varies responsive to variations in the piezo-resistive elements. The electrical signal is representative of the force applied to the surface of the pressure sensing die 100. The electrical signal is conducted via bond wires 209 to conductive pins 211 which may be electrically connected to other system circuitry, such as a control circuit, or converted to pressure data which may be stored, by way of non-limiting example, in an electronic memory.

The flexible diaphragm 221 and oil filled volume 219 isolate the die 100, bond wires 209 and conductive pins 211 from the corrosive or harsh media being measured via port 225. Additionally, the volume 219 containing the oil must be sealed such that leakage or contamination of the oil within volume 219 does not occur. Conductive pins 211 carrying the electrical signal from the pressure sensing die 100 must pass through the base plate 201 to allow external connection of other system components. Conductive pins 211 are enclosed in a glass or ceramic material fired into a tube or hole 213 which forms a hermetic seal with base plate 201. Hermetic seals are expensive to produce and fragile, but are necessary to ensure the integrity of the volume 219. A pressure sensor which provides isolation of the sensing components and associated circuitry from harsh media being measured in a simple and inexpensive form factor is therefore desired.

SUMMARY

In an embodiment, a differential pressure sensing die for measuring the differential pressure between two fluids includes a semiconductor die having an upper surface and a lower surface. The die includes an integral diaphragm having at least one piezo-resistive element. The at least one resistive element exhibits a varying resistance responsive to deflection and/or strain of the diaphragm. A first support structure is disposed on the upper surface of the semiconductor die. The support structure is a solid body having an aperture defined through the first support structure. The aperture is located in alignment with the diaphragm, thereby exposing the diaphragm through the first support structure. A second support structure is disposed on the lower surface of the semiconductor die. The second support structure is also a solid body and has an aperture defined through it that is adapted to expose the diaphragm through the second support structure.

In an embodiment, a differential pressure sensing die includes a semiconductor die having an upper surface and a lower surface, and having a first region at a first thickness, and a diaphragm having a second thickness less than the first thickness interior to the first region, the diaphragm having at least one piezo-resistive element, the at least one piezo-resistive element exhibiting a varying resistance responsive to deflection of said diaphragm. The differential pressure sensing die further includes a first support structure bonded to the upper surface of the semiconductor die, the first support structure having an aperture defined therethrough, the aperture aligned with the diaphragm. The differential pressure sensing die further includes a second support structure bonded to the lower surface of the semiconductor die, the second support structure having an aperture defined therethrough and aligned with the diaphragm.

In an embodiment, a differential pressure sensor includes a differential pressure sensing die, having a semiconductor die including an integral sensing diaphragm, a piezo-resistive element being defined on the diaphragm, a first support structure bonded to a surface of the semiconductor die, the first support structure having a first aperture defined therethrough exposing said sensing diaphragm through the first aperture, and a second support structure bonded to an opposing surface of the semiconductor die, the second support structure having a second aperture defined therethrough exposing the sensing diaphragm through the second aperture; an upper housing, defining an upper interior volume in fluid communication with said first aperture and having an upper flexible diaphragm defining a wall of the upper interior volume; a lower housing defining a lower interior volume in fluid communication with said second aperture, and having a lower flexible diaphragm defining a wall of the lower interior volume; and an electrical circuit coupled to the piezo-resistive element for determining a differential pressure applied to the sensing diaphragm.

In an embodiment, a differential pressure sensor is disclosed that includes a housing that defines an internal volume. Within the internal volume a differential pressure die is installed. The differential pressure die includes a semiconductor pressure sensing die having a diaphragm that has at least one piezo-resistive element formed on a surface of the diaphragm. A first support structure is bonded to one surface of the semiconductor pressure sensing die. The first support structure is a solid body having an aperture or passage therethrough, the aperture aligned with one side of said diaphragm. The first support structure is further bonded to the housing. A second support structure is bonded to a second surface of said semiconductor pressure sensing die, opposite the first support structure. The second support structure is a solid body having an aperture or passage therethrough. The aperture is aligned with a second side of the diaphragm and said second support structure further bonded to the housing. Two sealed volumes containing oil or other fluid serve to transmit pressure from respective exterior diaphragms to separate volumes of fluid and to opposing sides of the diaphragm of the die. Contact pads and other electrical components may be defined on the die in an area outside of the two sealed volumes and therefore isolated from the respective fluids. Piezo-resistive elements in the die diaphragm are responsive to deflection and strain of the diaphragm and are in communication with an electrical circuit package to output a signal indicative of the difference in the pressure exerted on the respective exterior diaphragms.

In an embodiment, a pressure sensor a differential pressure sensing die, having a first semiconductor die having an integral sensing diaphragm, a first piezo-resistive element being defined on the sensing diaphragm, a first support structure bonded to a surface of the first semiconductor die, the first support structure having a first aperture defined therethrough exposing said sensing diaphragm through the first aperture, and a second support structure bonded to an opposing surface of the first semiconductor die, the second support structure having a second aperture defined therethrough exposing the sensing diaphragm through the second aperture. The pressure sensor further includes an absolute pressure sensing die, having a second semiconductor die including an integral absolute pressure sensing diaphragm, a second piezo-resistive element being defined on the absolute pressure sensing diaphragm, a first absolute pressure support structure bonded to a surface of the second semiconductor die, the first absolute pressure support structure forming a seal around the second piezo-resistive element on the absolute pressure sensing diaphragm and a second absolute pressure support structure bonded to an opposing surface of the absolute pressure sensing semiconductor die, the second absolute pressure support structure having a third aperture defined therethrough exposing the absolute pressure sensing diaphragm through the third aperture. The pressure sensor further includes an upper housing, defining an upper interior volume in fluid communication with said first aperture and having an upper flexible diaphragm defining a wall of the upper interior volume; and a lower housing defining a lower interior volume in fluid communication with said second aperture and said third aperture, and having a second flexible diaphragm defining a wall of the lower interior volume. The pressure sensor further includes a first electrical circuit coupled to the piezo-resistive element of the differential pressure sensing die for determining a differential pressure applied to the diaphragm of the differential pressure sensing die; and a second electrical circuit coupled to the piezo-resistive element of the absolute pressure sensing die for determining an absolute pressure applied to the diaphragm of the absolute pressure sensing die.

In an embodiment, a package is disclosed for receiving a differential pressure sensing die, the die comprising a semiconductor die having an integral diaphragm adapted to measure a differential pressure applied to opposing sides of the diaphragm. The package includes a first housing member configured to receive the differential pressure sensing die; at least one second housing member, the first housing member and the at least one second housing member configured to mate with one another to define a housing, the housing having defined therein an interior volume for containing said differential pressure sensing die; a first port defined through a wall of said first housing member, said first port positioned to be aligned with an aperture defined in a first side of said differential pressure sensing die when said differential pressure sensing die is contained in said first housing member; and a second port defined through a wall of said second housing member, said second port positioned to be aligned with a second aperture defined in a second side of said differential pressure sensing die, opposite said first side, when said first housing member is mated with said first housing member.

In an embodiment, a package is disclosed for receiving a differential pressure sensing die, the die comprising a semiconductor die having an integral diaphragm adapted to measure a differential pressure applied to opposing sides of the diaphragm. The package includes a housing, defined by one or more housing members, the housing having a wall defining an interior volume configured to support and contain the differential pressure sensing die; a first port defined through the wall of said housing, said first port positioned to be aligned with an aperture defined in a first side of said differential pressure sensing die when said differential pressure sensing die is contained in the housing; a second port defined through the wall of said housing, said second port positioned to be aligned with a second aperture defined in a second side of said differential pressure sensing die when the differential pressure sensing die is contained in the housing, opposite said first side, when said first housing member is mated with said first housing member; and at least one electrical connection pin extending outward from the housing, and in electrical communication through the wall for connection to a lead in electrical communication with a piezo-resistive element formed in a surface of said diaphragm.

DETAILED DESCRIPTION

Measuring the pressure of a fluid is useful for determining and monitoring parameters such as operating pressures of fluids within a system. In some systems, such as vehicles, it is desirable to monitor pressure of corrosive or harsh fluids, such as fuel, oil or coolants. Pressure sensing devices and their related circuitry must be protected from such harsh media. Pressure sensors include a die, generally formed from a piece of semiconductor material. The die includes a relatively thin integral portion that defines a diaphragm. The diaphragm is configured to deflect in response to application of pressure. Piezo-resistive elements are defined on or in the diaphragm. The piezo-resistive elements exhibit electrical resistance which varies in response to strain on the elements. The deflection of the diaphragm in response to pressure applies strain to the piezoresistive elements. Thus, a circuit incorporating the piezo-resistive elements may provide electrical signals that are responsive to the force applied by a fluid against the diaphragm of the die. Suitable calibration and processing components provide output signals indicative of fluid pressure. The pressure measurement indicated by the electrical signal may be provided to other processing components for purposes such as display, control signals, diagnostic purposes or other purposes.

The piezo-resistive elements, the connections between them, contact pads, lead lines and the like, are formed from conductive material, such as metal or diffused areas of dopant defined in the semiconductor surface. The materials employed in these components are sensitive to corrosion by harsh media. Additionally, conductive fluids may affect the electrical signals in these conductive traces and metal connections, such as wire bonds. To perform pressure measurements while protecting the die, pressure sensors have been developed which define an enclosed volume extending from a surface of the diaphragm of the die. The enclosed volume is filled with a medium, such as an oil, which will not attack the metal components at the die. For example, in a silicon-based die, silicone oil may be used. The enclosed volume is defined in part by an outer diaphragm which is in contact with the fluid to be measured. The outer diaphragm may be formed from a corrosion resistive metal such as stainless steel or titanium, which may contact the harsh media without detriment. The pressure of the fluid being measured exerts force on the outer diaphragm. The outer diaphragm deflects in response to the pressure, and the deflection transmits force to the oil in the enclosed volume. The oil transmits the force to the diaphragm. In this way, the pressure exerted by the fluid being measured is conveyed to the die without the fluid being measured coming in contact with the die or electrical components on the die.

Figure 1:
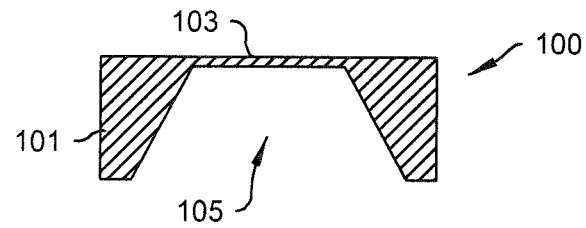
FIG. 1 is a sectional view of a pressure sensor die of the prior art.
Figure 2:
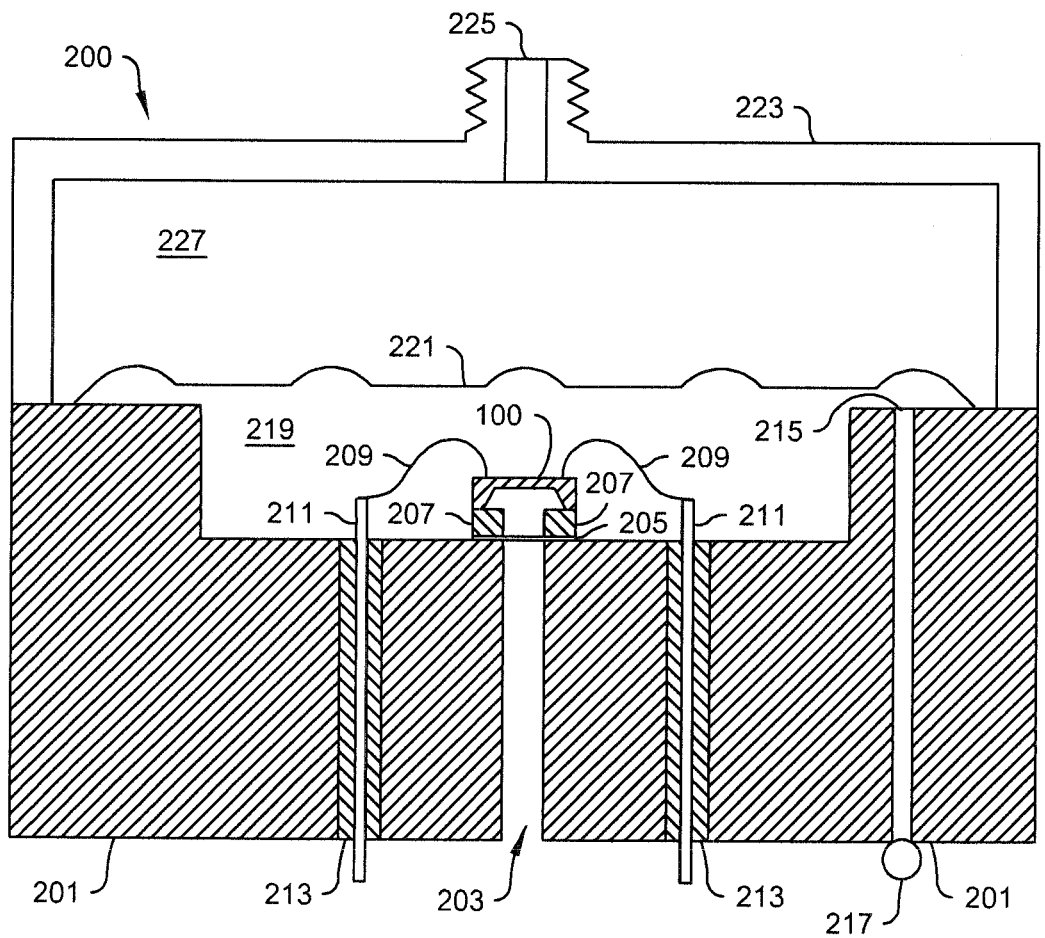
FIG. 2 is a sectional view of an isolated oil filled gage pressure sensor of the prior art.
Figure 3A:
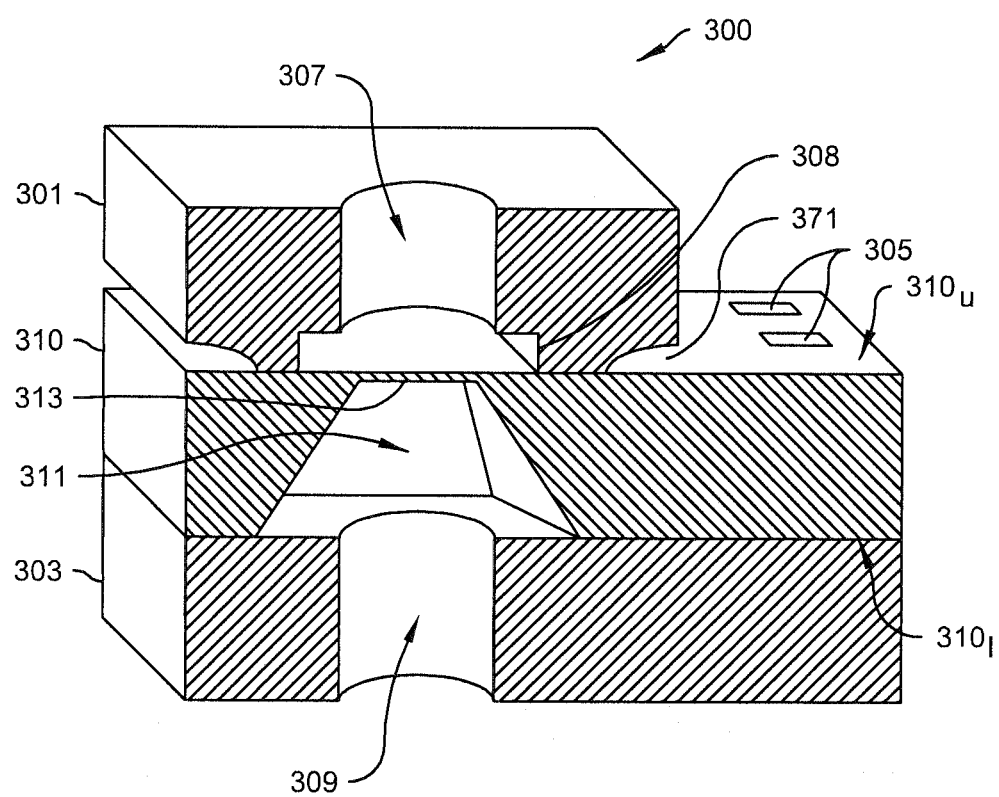
FIG. 3A is a sectional view of a differential pressure die according to an embodiment of the disclosure.

FIG. 3A shows a cross sectional view of a differential pressure sensing die 300 according to an embodiment of the disclosure. The differential pressure sensing die 300 is capable of measuring a pressure of differential pressure between a first fluid and a second fluid and producing an output signal that is representative of the measured differential pressure between the first fluid and the second fluid. A semiconductor die 310 is a solid body having a first region with a first, substantially uniform, thickness and a second region having a second, also substantially uniform, thickness which is less that the first thickness. The second region defines an integral diaphragm 313 having a thickness substantially less that the thickness of the surrounding areas of semiconductor die 310. The diaphragm 313 is an integral part of semiconductor die 310. The semiconductor die 310 includes a first generally planar upper surface $310_u$ and a second lower surface $310_l$ opposing the first upper surface $310_u$. Second lower surface $310_l$ is generally planar except in the second region defining integral diaphragm 313. Chamber 311, closed at one end by diaphragm 313, open at an opposite end and defined by a continuous side wall interior to die 300, is shown.

A first support structure 301 (which may also be referred to as a "constraint") is provided on and attached to the upper surface $310_u$ of semiconductor die 310. First support structure 301 may be a solid body having planar, parallel upper and lower surfaces. A recess 308 may be defined in the lower surface of support structure 301. The recess 308 is a rectangular or square shaped recess defining a space in the lower surface of the upper support structure 301 having an area which is greater than the area defined by diaphragm 313. The lower surface of first support structure 301 is in contact with and attached to upper surface $310_u$ of semiconductor die 310. An aperture 307 is defined through first support structure 301, terminating at the recess 308 defined in the lower surface of first support structure 301. Aperture 307 provides a continuous open passage between the upper surface of first support structure 301 and the lower surface of first support structure 301. The aperture 307 may have a cylindrical cross section, as shown. Aperture 307 may be aligned with diaphragm 313. Aperture 307 may be configured to have a diameter that corresponds to, or slightly exceeds, a diameter of diaphragm 313. The interior of aperture 307 is thus in communication with an upper surface of diaphragm 313. The bond between the first support structure 301 and the upper surface of semiconductor die 310 is impervious to fluid.

A second support structure 303 (which may also be referred to as a "constraint") is attached to the lower surface $310_l$ of semiconductor die 310. The second support structure 303 is a solid body having planar parallel upper and lower surfaces. Second support structure 303 has an aperture 309 defined through the support structure 303. Aperture 309 provides a continuous open passage between the upper surface of second support structure 303 and the lower surface of second support structure 303. Aperture 309 may be cylindrical as shown and may be aligned with the open end of chamber 311. Thus, the interior of aperture 309 is in communication with a lower surface of diaphragm 313 via chamber 311. Aperture 309 may be sized such that the inside dimension of the aperture 309 is substantially equal to, or slightly larger than, the diameter of diaphragm 313. The second support structure 303 is bonded to the lower surface $310_l$ of the semiconductor die 310 to provide a fluid-impervious seal around the open end of chamber 311.

Contact pads 305 are defined on the upper surface $310_u$ of semiconductor die 310. Contact pads 305 are of metal, and are defined on a portion of the upper surface $310_u$ of die 310 exterior to upper support structure 301.

Figure 3B:
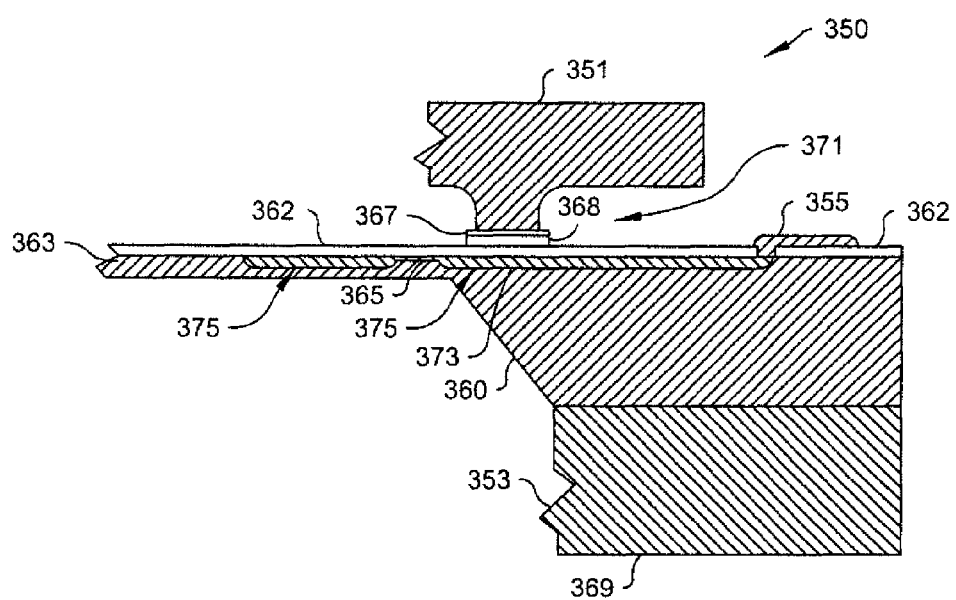
FIG. 3B is a partial sectional view of an embodiment of a differential pressure die according to the disclosure, showing the interface between the semiconductor and support structures in greater detail.

FIG. 3B shows a partial cross section of a differential pressure die 350, similar to the differential pressure sensing die 300 of FIG. 3A. In FIG. 3B, the region defining the interface between the upper support 351, the semiconductor die 360, and the lower support structure 353 is shown in greater detail. A structure 375 is defined by suitably diffused dopants in an upper surface of semiconductor diaphragm 363. The structure extends beyond an edge of semiconductor diaphragm 363 to other portions of the upper surface of die 360. Structure 375 includes piezo-resistive element 365 and conductive region 373 that serves as a conductive line for carrying electrical signals from the piezo-resistive elements to contacts the facilitate connection to circuitry external to the die. The piezo-resistive element 365 and conductive region 373 may be formed by differentially diffusing one or more dopants within the semiconductor material to define a piezo-resistive elements and conductive circuit elements, using techniques and materials well known in the art. Conductive region 373 provides electrical communication between piezo-resistive element 365 and contact pad 355. Piezo-resistive element 365 may be representative of a plurality of piezo-resistive elements, and conductive region 373 may be representative of a conductive path in the semiconductor material to complete circuits including the piezo-resistive elements 365 and multiple contact pads 355. Oxide layer 362 may be disposed over the upper surface of die 360, including the upper surface of semiconductor diaphragm 363 and the structure 375. Contact pads 355 may be disposed on oxide layer 362. Metalized vias may be provided through oxide layer 362 to provide electrical connection between contact pads 355 and conductive line or region 373.

A bonding layer 368 is shown intermediate oxide layer 362 and upper support structure 351. Bonding layer 368, by way of example, may be a polysilicon layer disposed on the upper surface of the semiconductor die 360. The upper support structure 351 may be anodically bonded 367 to the bonding layer 368. The lower support structure 353 may be anodically bonded to a region of exposed silicon on the underside of the semiconductor die 360. Bonding layer 368 may be of suitable materials as to be impervious to a fluid.

Upper support structure 351 may be undercut around its lower outer edge to define an outer recess 371. Outer recess 371 provides space for running electrical connections, such as electrical traces used in the electrical circuitry of the differential pressure sensing die 300.

A lower surface 369 of second support structure 353 may provide an outer bonding surface. An outer bonding surface may be attached via an adhesive within a package. The package may include circuits and connections to obtain resistance values from piezo-resistive elements and to process those values, and output processed data representative of detected differential pressure values.

Semiconductor die 360 may be of single-crystal silicon or other suitable semiconductor material. The first and second support structures 351, 353 are of materials having a coefficient of thermal expansion similar to the coefficient of thermal expansion of the semiconductor material making up the semiconductor die 360. The first and second support structure 351, 353 further provide a stable support structure for the semiconductor die 360 providing an area for attaching the die 350 to the housing of a pressure sensor without having to attach the sensor housing directly to the semiconductor material. For example, the first and second support structures 351, 353 may be formed from silicon, or other materials, such as glass or PYREX, which are chemically inert and can be bonded to the silicon of the semiconductor die 360.

Maintaining the coefficient of thermal expansion of the support structure 351, 353 to be close to that of the semiconductor die 360, reduces or eliminates forces applied to the semiconductor die 360 not related to pressure, such as different rates of thermal expansion between the die and the support structure.

Referring again to FIG. 3A, semiconductor die 310 may be manufactured by dicing a semiconductor wafer into rectangular pieces. According to one embodiment, each semiconductor die 310 is based on a semiconductor cube having an outside dimension of about 2 millimeters (mm). A region having a lesser thickness is defined by removing a portion of the semiconductor cube to define a region forming diaphragm 313. The portion may be removed by etching or other processes known in the art. For example, anisotropic etching may be used to produce a substantially square diaphragm 313 having an outside dimension of 1 mm according to an exemplary embodiment. When forming support structures 301, 303, apertures 307 and 309 are formed by etching processes and may produce an aperture having a cross sectional profile resembling a square having rounded corners. The apertures 307, 309 are created to have an inside dimension that is equal to or slightly larger than the perimeter dimensions of the diaphragm 313. The upper support structure 301 may include a recess in its lower surface which defines an opening in the lower surface of the upper support structure 301 which ensures that no portion of the semiconductor diaphragm 313 is covered by the upper support structure 301. This allows a fluid to pass through the aperture 307, 309 and come into fluid communication with the entire surface of the diaphragm 363. Support structures may be bonded to the semiconductor die 310 using any suitable adhesive. By way of example, the first support structure 301 may be anodically bonded to a polysilicon layer 318 on the upper surface of the semiconductor die 310; the second support structure 303 may be anodically bonded to the exposed semiconductor material on the underside of semiconductor die 310. Depending on the respective materials of the die and the support structures, other bonding processes, such as anodic bonding, silicon fusion bonding, glass frit bonding or other techniques may be used to bond support structures to the semiconductor die 310.

The operation of differential pressure sensing die 300 will now be described. Differential pressure sensing die 300 is incorporated into a structure, such as a differential pressure sensor package, that provides a first fluid port with a sealed bond to aperture 307 and a second fluid port with a sealed bond to aperture 309. The first fluid port receives a first fluid under pressure, and the second fluid port receives a second fluid under pressure. The upper portion of die 310 exterior to support structure 301 is isolated from both the first and second fluid. The first and second fluids fill the apertures 307, 309 and chamber 311 and apply pressure to respective upper and lower sides of diaphragm 313. Diaphragm 313 flexes and undergoes strain, which results in changes in resistance of piezo-resistive elements 315. The differential pressure may be determined by processing of signals indicative of resistance of piezo-resistive elements 365, and thus of the differential pressure applied on diaphragm 313 by the respective first and second fluids. Processing devices in electrical communication with contact pads 305 may determine a differential pressure value based on data from piezo-resistive elements 315. Oxide layer 312 provides protection of metal components on an upper surface of diaphragm 313 from a first fluid. The second fluid contacts silicon and glass in the aperture and the lower side of the die.

In certain applications, the fluids being measured may be corrosive in nature. Corrosive fluids may damage electrical components on the differential pressure sensing die 300, or may even attack bonds. To protect the components, an isolating volume of fluid, such as an oil, may be placed between the differential pressure sensing die 300 and the fluid being measured. In this embodiment, a first volume is defined having a first fluid port in sealed communication with aperture 307. An upper flexible diaphragm forms a wall of the first volume. The upper flexible diaphragm may be of a metal, such as stainless steel, titanium or brass, that is impervious to the fluid being measured. The first volume is filled with a less harsh fluid, such as an oil. The pressure of the fluid being measured deflects the diaphragm, thereby transferring the pressure to the oil in the first volume, which reaches the diaphragm via aperture 307. A second, lower flexible diaphragm similarly defines a wall of a second volume filled with oil and filling aperture 309 and reaching the lower side of diaphragm 313. The lower flexible diaphragm may be in contact with a second fluid to be measured, and similarly transfer the pressure of the second fluid via the oil in the second volume to the lower side of the diaphragm. Thus, this arrangement of die 300 with two sealed volumes of oil permits differential pressure measurement of corrosive fluids. In this way, the differential pressure sensing die 300 is isolated from the fluids being measured in order to protect the sensitive electrical components on the die.

Figure 4A:
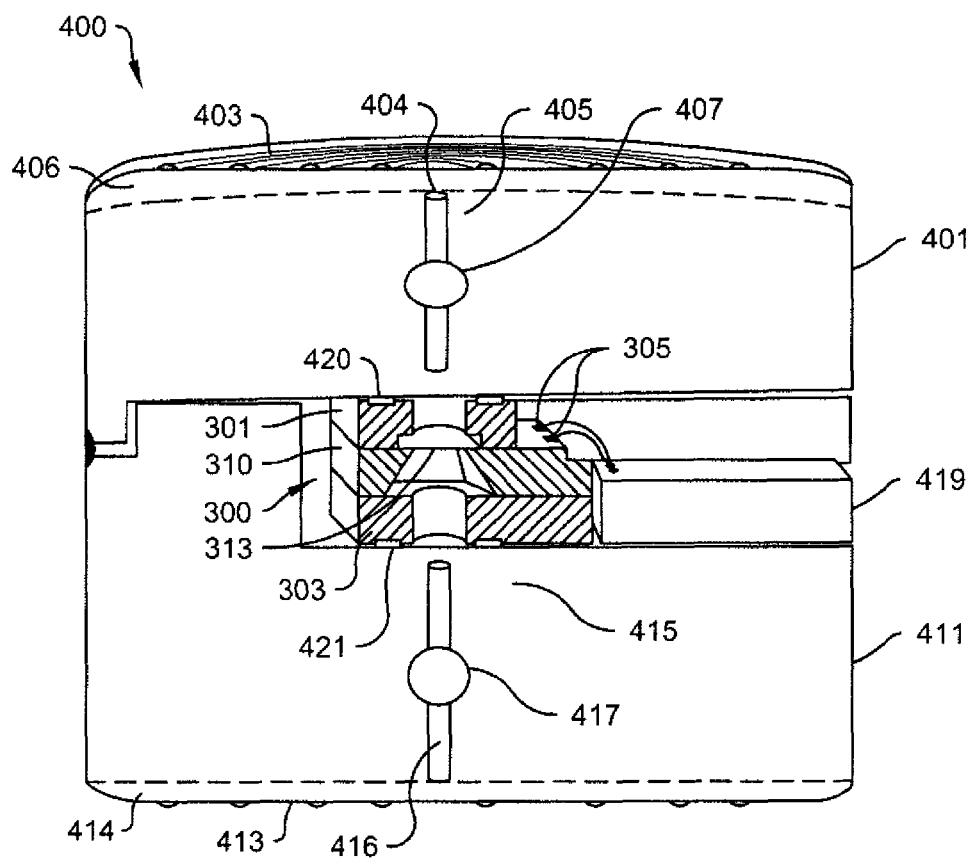
FIG. 4A is a sectional view of an isolated differential pressure device according to an embodiment of the disclosure.
Figure 4B:
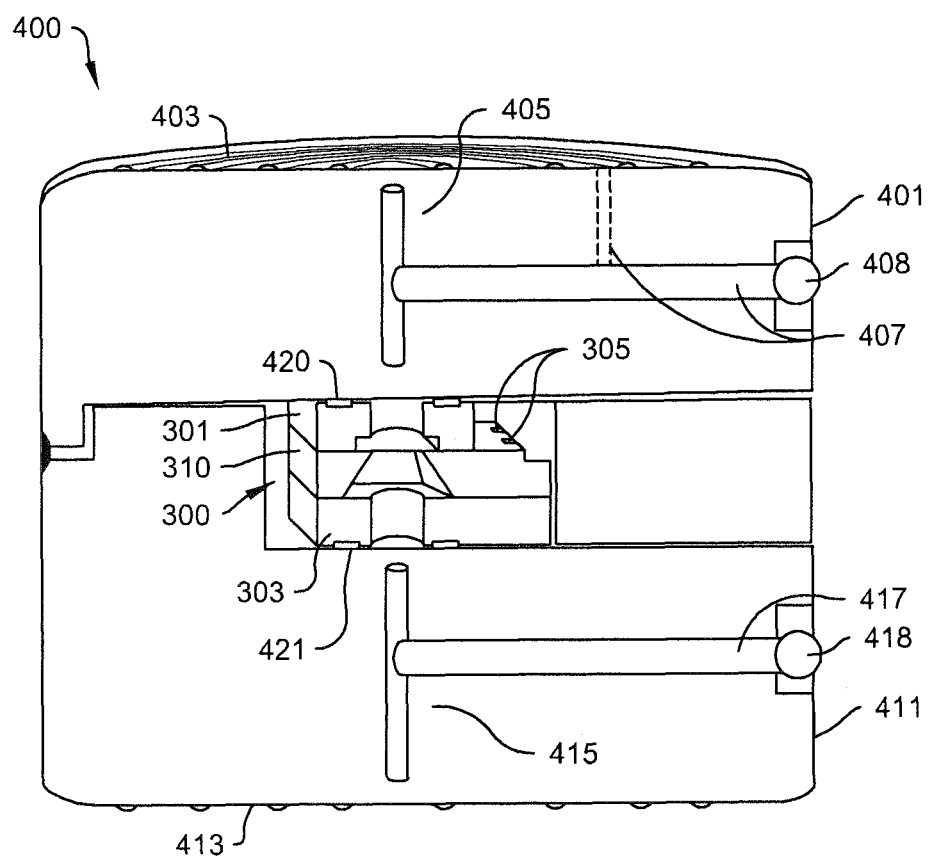
FIG. 4B is a sectional view of the differential pressure device of FIG. 4A rotated 90 degrees to show the oil fill lines.

Referring now to FIG. 4A, a cross sectional view of an embodiment of an oil-filled differential pressure sensor 400 including a package incorporating the differential pressure sensing die 300 of FIG. 3A is shown. FIG. 4B shows the oil-filled differential pressure sensor 400 of FIG. 4A rotated 90 degrees to better illustrate the oil-fill tube 417 and welded ball seal. A package for housing the differential pressure sensing die 300 includes a first upper housing 401 and a second lower housing 411. Both housings 401, 411 include solid bodies 405, 415 with an interior oil-filled volume. A lower wall of the solid body 405 of upper housing 401 is bonded to the differential pressure sensing die 300 at the first support structure 301. The bond creates a fluid tight seal 420 between the first support structure 301 and the upper housing 401. The first support structure 301 has aperture (307, shown in FIG. 3A) which forms an upper port that provides access to the top surface of semiconductor diaphragm 313 of semiconductor pressure die 310. In the embodiment of the differential pressure sensor 400 of FIG. 4A, upper housing 401 includes a flexible diaphragm 403. Flexible diaphragm 403 is opposite to the lower wall of the solid body of upper housing 401 bonded to the differential pressure sensing die

300. The flexible diaphragm 403 is, when sensor 400 is deployed, in fluid contact with the fluid to be measured, which may be a harsh medium. Flexible diaphragm 403 may be of a metal which is resistant to corrosion due to contact with the harsh medium. By way of non-limiting example, the flexible diaphragm 403 may be of stainless steel or titanium, either of which provides corrosion resistance to most harsh media.

The upper housing 401 includes a volume suitable to be filled with a fluid, such as oil, filled, and sealed. In each of the embodiments disclosed in this application having a volume to be filled with fluid and sealed, one wall of the volume is a flexible diaphragm; other walls of the volume are rigid, and the volume engages the sensor die diaphragm. Pressure applied to an outer side of flexible diaphragm stresses and/or deflects the sensor die diaphragm. Other walls of the volume are rigid such as by virtue of relative thickness, such as being of relatively thick steel, or of glass or silicon of the support structures. In embodiments, an upper or lower housing may be entirely hollow, and thus suitable to be filled entirely with oil. In other embodiments, the upper or lower housing may be a solid body, such as a solid body of a stainless steel alloy, titanium alloy, or other metal, with a hollow central bore, opening at one end to the upper or lower flexible diaphragm, and at an opposite end to a support structure. In other embodiments, the volume suitable to be filled with a fluid may have other shapes and forms.

Flexible diaphragm 403 serves as a wall of the oil-filled volume. In this embodiment, a tube 404 may extend from flexible diaphragm 403 to the corresponding aperture in support structure 301. Flexible diaphragm 403 may in embodiments be supported on a lip or rim around an upper wall of solid body 405, to define a cavity that is part of the volume to be filled with fluid. The internal volume 406 may be suitable to be entirely filled with oil to receive a force applied by flexible diaphragm 403. Alternatively, a smaller volume to be filled with oil within the housing may be defined. Oil is introduced via tube 404 into volume 406 which is in fluid communication with flexible diaphragm 403. A fill tube 407, best seen in FIG. 4B, extends from tube 404 to an outer wall of solid body 405. This tube 407 can join to any portion of the empty cavity between the metal diaphragm 403 and the sensing die 300 as it is only used to fill this cavity with fluid. When the volume is filled, the fill tube may be plugged with a ball 408, which may be welded to the solid body. In other embodiments, a fill tube may be closed by crimping, welding the edges together, pressing a pin into the fill tube, or otherwise. Tube 404 is generally a tube open at one end and opening to a volume adjacent flexible diaphragm 403 and open at the other end and defining a port in sealed contact with the aperture of first support structure 301 of the differential pressure sensing die 300. The oil or other fluid employed to fill the volume is selected for its compatibility with the semiconductor pressure die 310. In one embodiment, silicone oil is used. In other embodiments, upper housing 401 may have circumferential walls and be entirely filled with fluid. In such an embodiment, the side and bottom walls must be sufficiently thick to be rigid, so that the pressure applied the exterior of the diaphragm 403 is transferred to the diaphragm of the semiconductor die, and does not serve to deform the walls of the upper housing.

The lower housing 411 is bonded to the differential pressure sensing die 300 at the second support structure 303. The second support structure 303 is bonded to create a fluid tight seal 421 between the second support structure 303 and the lower housing 411. Lower housing 411 includes a solid body 415 which contacts and is attached to upper housing 401 by welding, brazing or adhesives, while defining a volume intermediate the upper and lower housings. The volume contains the die 300 and provides space for an electronic circuit 419 in communication with the piezoresistive elements of die 300. This intermediate volume is sealingly separated from the fluid-fillable volumes in the upper and lower housings. The support structure 303 is in contact with and bonded to an upper surface of solid body 415. The solid body 415 has a passageway or tube 416 that is aligned with the aperture of second support structure 303 to provide access to the bottom surface of diaphragm 313. The internal volume 414 may be entirely filled with oil to receive a force applied by flexible diaphragm 413. Alternative, a smaller volume 414 may be defined. Oil is introduced via tube 416 into volume 414 which is in fluid communication with flexible diaphragm 413. The aperture of second support structure 303 is thus in sealed communication with one end of a tube. The opposite end of tube 416 is, in embodiments, closed by lower diaphragm 413, or in communication with a volume in contact with diaphragm 413. An oil-fill tube 417 is in communication with tube 416 or any volume of oil between the diaphragm 413 and the die 300 and with an exterior of the lower housing. Oil-fill tube 417 may be closed, such as by ball 418 shown in FIG. 4B. Diaphragm 413 forms a lower wall and seal of lower housing 411 opposite die 300. The flexible diaphragm 413, similar to diaphragm 403, may be in contact with harsh media, and of a metal which is resistant to corrosion from contact with the harsh medium. The oil placed in the oil-filled volume of the lower housing is selected for its compatibility with the silicon pressure die 100. In an embodiment, silicone oil may be used.

The operation of the differential pressure sensor 400 will now be described. The differential pressure sensor 400 is installed in a package which receives two fluids whose pressure is to be measured. A first fluid is introduced to the upper flexible diaphragm 403 through a first port in the package. Flexible diaphragm 403 is in fluid communication with the first fluid and force from the pressure of the first fluid is exerted on the upper surface of flexible diaphragm 403. The force exerted on the upper surface of the flexible diaphragm 403 causes the diaphragm to flex and exert pressure on oil in the upper housing. The pressure exerted on the enclosed oil is transmitted through the oil to the upper side of the diaphragm 313. A second port is provided in the package containing differential pressure sensor 400 which receives a second fluid which is introduced in a manner similar to the first fluid in fluid communication with flexible diaphragm 413 which exerts a force on oil in the lower housing, which is, in turn, in fluid communication with the underside of the semiconductor diaphragm 313 of semiconductor pressure die 310. The pressure of the first fluid exerts a downward pressure (in the orientation shown in FIG. 4) while the pressure of the second fluid provides an opposing upward pressure on the underside of the silicon diaphragm 313. The difference in the pressures applied to the diaphragm causes deflection and/or strain of diaphragm 313, which may be measured by detecting changes in resistance in piezo-resistive elements and associated circuitry of differential pressure sensing die 300. The electrical signal is provided as output from the differential pressure sensing die 300 through electrically conductive contact pads 305 which are further electrically connected to circuitry 419. Circuit 419 may contain application specific integrated circuits (ASICs) or other circuitry to provide calibration for the sensor and provide a digital or analog electrical output commonly used by sensors. Electrically conductive contact pads, as they are exterior to upper support structure 301, are not contacted by fluid used to transmit force to the diaphragm of the die. Suitable contacts, such as wires, pins or connectors are connected to circuitry 419 to provide output of data signals, as well as input power connection contacts, may be provided in the differential pressure sensor 400.

When using an oil-filled type pressure sensor, care must be taken that temperature fluctuations in the enclosed oil, do not cause increases or decreases in the density of the oil. Such density changes could exert forces on the pressure sensing die unrelated to the pressure being measured. In the differential pressure sensor 400 of FIG. 4A, the comparative volumes of oil-filled volumes in upper and lower housings are substantially equal. Therefore, any temperature change-induced variation in the density of one volume will be counteracted by an equal variation in the opposite direction by the opposing volume. As a result, calibration of the semiconductor pressure die 310 to compensate for temperature changes may be reduced or unnecessary.

Figure 5A:
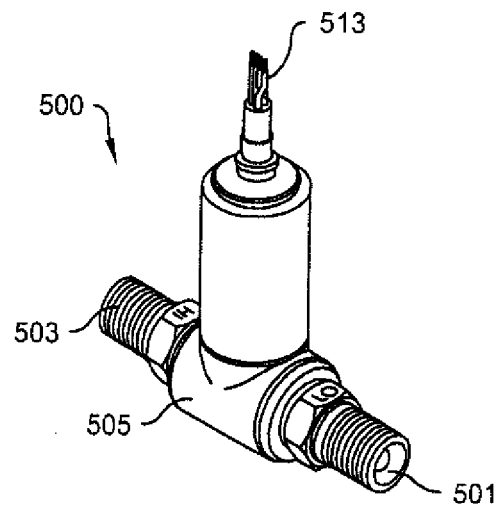
FIG. 5A is an isometric view of a housing and differential pressure sensor according to an embodiment of a differential pressure device of the disclosure.
Figure 5B:
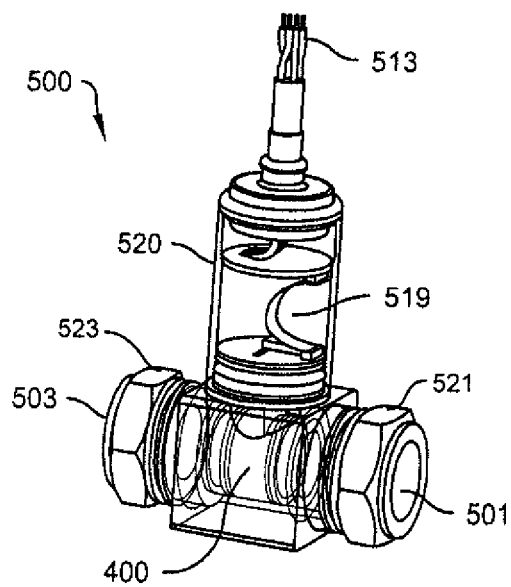
FIG. 5B is a ghost view of the housing and differential pressure sensor of FIG. 5A.

FIG. 5A and FIG. 5B illustrate a package 500 which may be configured to house the differential pressure sensor 400 of FIG. 4. Package 500 includes a main housing 505 which defines an interior volume for receiving the differential pressure sensor 400. The package 500 includes a first fluid port 501 and a second fluid port 503 which receive a first and second fluid, respectively. Fluid ports 501, 503 may include a flanged or ridged end for receiving a hose or tubing carrying the first and second fluids to be measured according to the embodiment shown in FIG. 5A and FIG. 5B, fluid ports 501, 503 are threaded to receive a fitting 521, 523 of the hose or tubing.

The package 500 includes an electrical circuit region 519 which includes circuitry in electrical communication with the circuitry of differential pressure sensor 300. For compensated applications, other chips and circuitry are typically installed along side the pressure sensor 400 in the housing. This circuitry is used to calibrate the sensor and also provide analog or digital outputs that are commonly used for sensors. The electrical circuit region 519 may be in electrical communication with conductive terminals, such as automotive style connector wires 513 to allow electrical connection of system circuitry via a plug or wiring harness. Circuit region 519 is located within housing 520. Circuit region 519 is isolated from the fluids being tested within the main housing 505. The upper and lower housings may be so configured to provide that the circuit region is thus physically isolated from the fluids being tested as well as oil or other fluids used to transmit force to the semiconductor diaphragm.

Figure 6A:
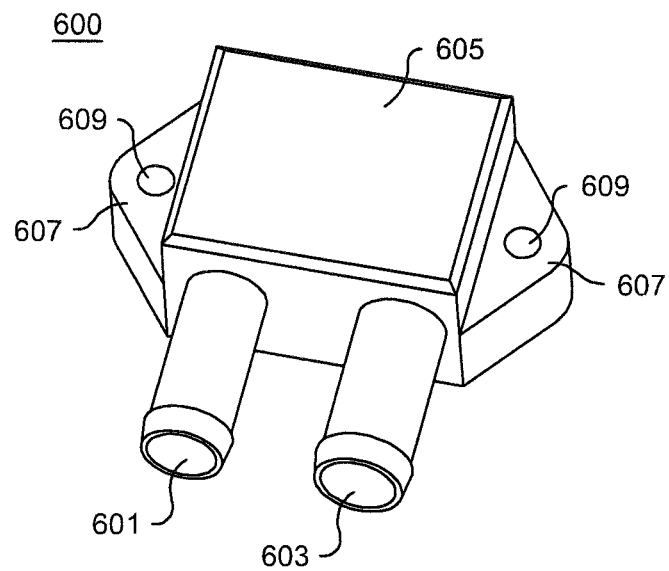
FIG. 6A is an isometric view of a differential pressure device according to an embodiment of the disclosure.
Figure 6B:
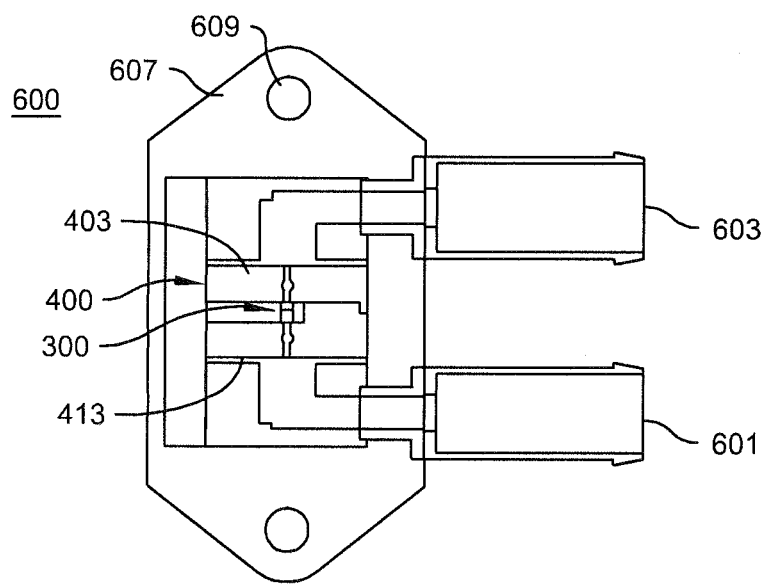
FIG. 6B and FIG. 6C show sectional views of embodiments of the differential pressure device of FIG. 6A

FIG. 6A and FIG. 6B show a package for housing a differential pressure sensor 300. The package may be formed from a plastic or other material that can withstand non-corrosive or mildly corrosive fluids. The package may include a flanged portion 607 which includes a hole 609 allowing attachment of the package 600 to a surface by way of a fastener such as a screw or bolt. For example, the package 600 may be adapted to be attached to the frame of a truck or other vehicle. The housing 602 may be configured with a lid (not shown) allowing access to the interior volume of package 600. The internal volume may include additional fastening holes 609 for attaching the package 600 to a surface, and such holes may include a wall which extends from the main housing 602 for aligning the screw hole with the mounting hole on the surface to which the package 600 is mounted.

Package 600 includes an electrical circuit region (not shown) which includes circuitry in electrical communication with the circuitry of differential pressure sensor 400. The electrical circuit region may be in electrical communication with conductive terminals or pins 513 (as shown in FIG. 5A) to allow electrical connection of system circuitry via a plug or wiring harness. Package 600 may be mounted on a vehicle, for example a truck, for sensing a differential pressure of an engine component associated with the vehicle. By way of example, the vehicle may have a replaceable oil filter, which screws onto the engine by way of a threaded stud. Oil is pumped through the threaded stud, through the filter elements in the replaceable filter, and returns to the engine as filtered oil. When the filtering elements are new, or relatively clean, restriction of the flow of oil through the filter is minimal. As dirt and deposits are filtered from the oil, they begin to clog the filtering elements and restrict flow of oil through the filter. When flow restriction is low, the difference in oil pressure at the inlet versus the outlet of the replaceable oil filter is small. As the flow becomes restricted, pressure will build at the inlet of the oil filter due to the backup of oil in a finite volume, while the oil pressure at the outlet of the oil filter will drop due to the reduced oil flow, resulting in increasing differential pressure between the inlet and the outlet as the flow becomes more restricted.

The package 600 may be mounted on the vehicle engine or other suitable place such as the chassis. Hoses may be placed between the inlet of the oil filter to the first fluid port 601 of package 600 and between the outlet of the oil filter and the second fluid port 603 of package 600. An electrical signal is provided at electrical connection pins which is representative of the differential oil pressure across the oil filter. The electrical signal may be used by diagnostic or control circuitry to determine the condition of the replaceable oil filter. For example, when the differential oil pressure across the oil filter reaches or exceeds a predetermined level, control systems in the vehicle may be adapted to provide an alert to the operator indicating the filter needs to be replaced. Over time, electrical signals indicative of the differential oil pressure across the oil filter may be used to determine the operational state of the oil filter. Data derived from the electrical signals may be stored, for example in a computer memory, and used for future analysis. For example, in the case of engine failure, a historical view of the operational state of the oil filter over the life of the engine may be analyzed to determine if the oil filter was a contributing factor to the engine failure. A historical record of the operational state of the oil filter may also be used to determine if replacement of the engine oil and/or oil filter has been performed according to the manufacturer's recommended service and maintenance schedule.

Figure 6C:
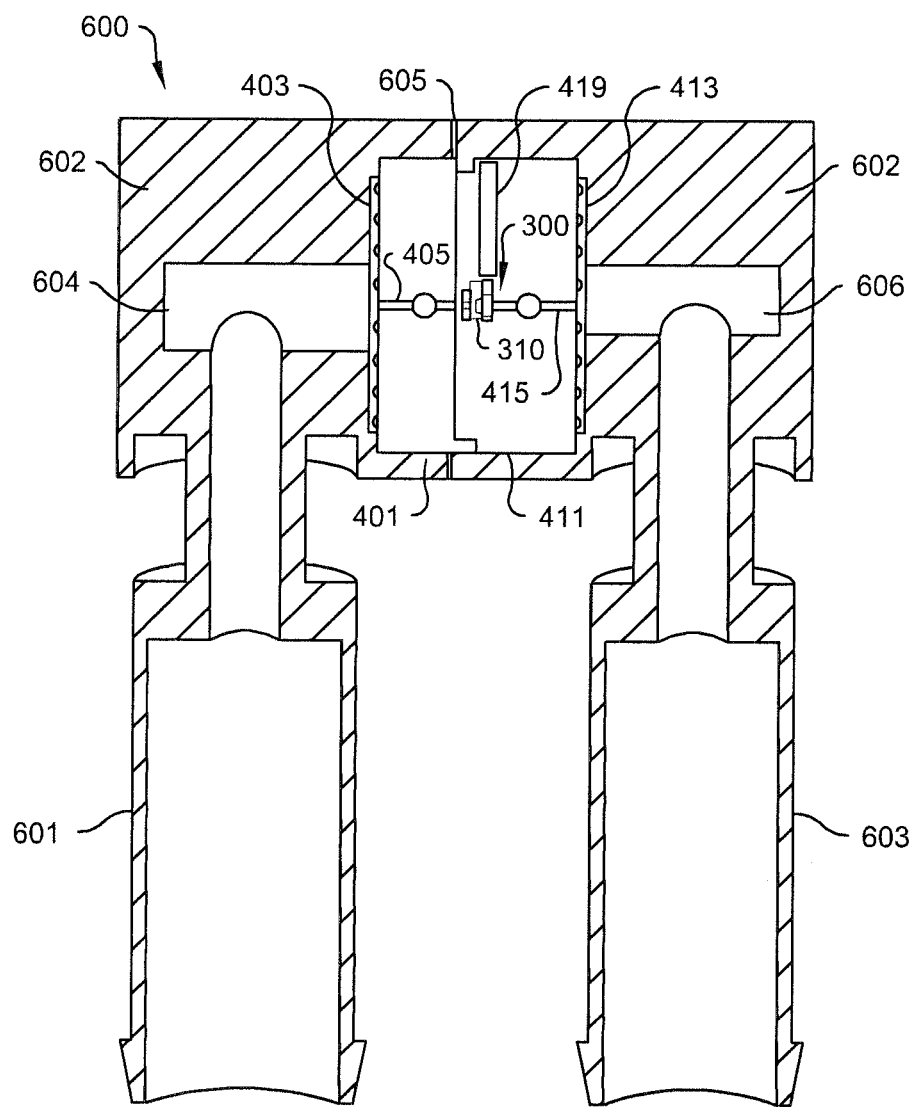

FIG. 6C is a cross sectional view of a differential pressure sensor package 600 incorporating the differential pressure sensor of FIG. 4. Sensor package 600 includes a housing 602 defining a first fluid port 60' and a second fluid port 603 for receiving a first and second fluid having a pressure to be measured. In embodiments, the housing 602 is defined as a first and a second housing member, which housing members are configured to mate with one another. The first and second housing members may be joined at a seal 605. In embodiments, housing 602 may be unitary or may include more than two housing members configured to mate with one another. When the housing members of housing 602 mate with one another, an interior volume is defined within the housing. The interior volume is sized and configured to receive and support a differential pressure sensor. A differential pressure sensor, such as the differential pressure sensing device of FIG. 4A is inserted into the interior space of the housing 602. The two members are connected and sealed at seal 605 to enclose the differential pressure sensor in the housing 602 in a fluid tight manner.

Interposed between the differential pressure die 300 and the fluid ports 601, 603, are upper and lower housings, as described above in connection with FIGS. 4A and 4B.

A first fluid enters fluid port 601 and flexes flexible diaphragm 403 which then transmits the force via oil or other isolated fluid to the underside of the differential pressure sensing die (as shown in the orientation of FIG. 4C). Similarly, a second fluid enters fluid port 603 and flexes flexible diaphragm 413 which then transmits the force via oil or other isolated fluid to the topside (as shown in the orientation of FIG. 4C) of the differential pressure sensing die 300. The first and second fluids each indirectly apply pressure to the opposing sides of the semiconductor diaphragm. If the respective pressures of the first and second fluids differ, the resulting differential pressure between the two fluids stresses and/or deforms the semiconductor diaphragm. The electrical resistance of the piezo-resistive elements disposed on the surface of the semiconductor diaphragm changes responsive to such stress and/or deformation. The electrical resistance is measured by supplying an electrical current through the piezo-resistive element which is carried via bond wires to an electrical circuit. The electrical signal is processed in the circuitry and made available to external circuits via electrical contact pins or wires 513, shown in FIG. 5A or other connection method such as a connector.

The package may be configured having mounting holes 609 for attaching the package to a vehicle frame or chassis. In such an embodiment, the first and second fluid ports 601, 603 may be attached to a fluid hose or line connected to a fluid used to operate the vehicle. For example, engine oil may be introduced through fluid ports 601, 603 to measure the differential pressure between two points in the vehicle's oil circulation system.

FIG. 6C is a cross sectional view of a differential pressure sensor package 600 incorporating the differential pressure sensor of FIG. 4. Sensor package 600 includes a housing 602 defining a first fluid port 60' and a second fluid port 603 for receiving a first and second fluid having a pressure to be measured. The housing 602 is defined as two members which are joined at a seal 605. A differential pressure sensor, such as the differential pressure sensing device of FIG. 4A is inserted into the interior space of the housing 602. The two members are connected and sealed at seal 605 to enclose the differential pressure sensor in the housing 602 in a fluid tight manner.

A first fluid is placed in fluid communication with the first fluid port 601; the first fluid fills the first fluid port and enters a first pressure chamber 604 which is in fluid communication with flexible diaphragm 403. The flexible diaphragm 403 is in fluid contact with an oil-filled volume on the side of the flexible diaphragm 403 opposite the first fluid. A second fluid port 603 is configured similarly to fluid port 601, allowing a second fluid to enter second pressure chamber 606. Second pressure chamber 606 is in fluid communication with flexible diaphragm 413. Flexible diaphragm 413 is in fluid communication with an oil-filled volume which is in turn in communication with the diaphragm of differential pressure sensing die 300. The differential pressure between the first fluid in pressure chamber 604 and the second fluid in second pressure chamber 606 is embodied as a net force applied against the silicon diaphragm of differential pressure sensing die 300. The force is converted to one or more resistance values of the piezo-resistive elements, which in turn may be communicated to circuit 419 and processed. The output of circuit 419 includes data indicative of detected differential pressure. Connectors to circuit 419 are accessible external to the differential pressure sensor package 600. Pressure chambers 604, 606 may be adapted to be perpendicular to their respective fluid port 601, 603 to establish fluid communication between the first and second fluid and the differential pressure sensing die 300.

Figure 7:
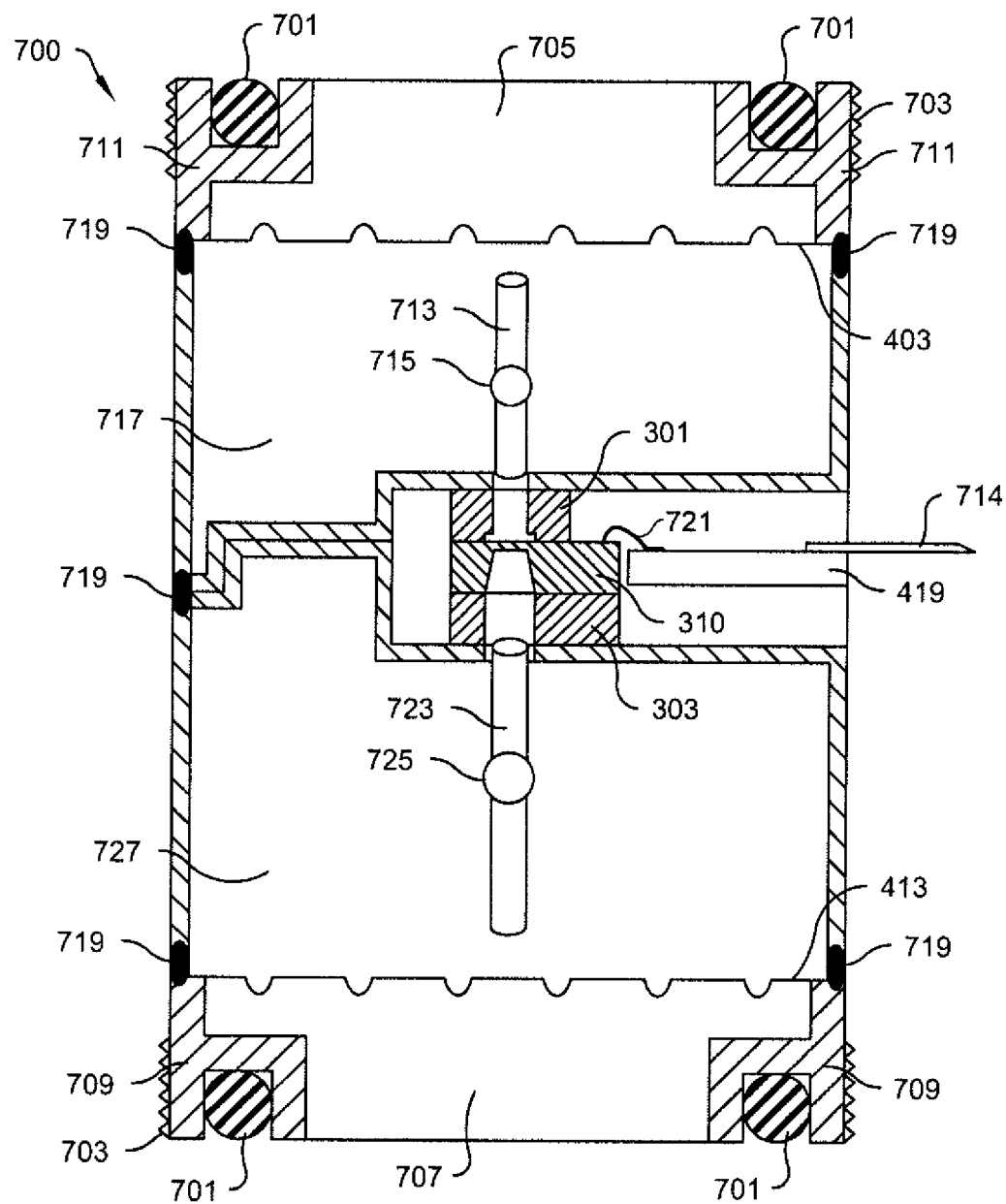
FIG. 7 is a sectional view of a differential pressure device having an O-ring mount according to an embodiment of the disclosure.

FIG. 7 is a cross sectional view of an isolated, oil-filled pressure sensor 700 having an O-ring connection fitting. The pressure sensor 700 provides differential pressure measurement while isolating the pressure sensing die from direct exposure to the fluids being tested. The pressure sensing die is isolated from the test fluids by a first volume of oil in tube 713 which isolates the first fluid being tested from the pressure sensing die, and a second volume of oil in tube 723 which isolates the second fluid being tested from the pressure sensing die.

The pressure sensing die includes a semiconductor pressure die 310 which includes an integral diaphragm (313 as shown in FIGS. 3A and 3B). The diaphragm has piezo-resistive elements defined in the semiconductor which exhibit varying electrical resistance based on the force applied by pressure on the diaphragm in the semiconductor pressure die 310. The upper and lower surfaces of the semiconductor pressure die are supported by a first support structure 301 and a second support structure 303. The support structures 301, 303 have apertures defined therethrough, the apertures being aligned with the diaphragm to allow oil in the tubes 713, 723, and oil-filled volumes 717, 727 to come into fluid communication with the upper and lower surfaces of the diaphragm, respectively.

The tubes and other volumes may be filled through oil fill lines having ports 715, 725 through which oil is introduced. The ports 715, 725 may be sealed by welding a metal ball over the port opening, or the port may have an elongated section which is crimped or folded to seal the port, by way of example.

A flexible diaphragm 403, 413 defines a surface that makes up a wall of oil-filled volumes. In embodiments, the housings may be filled with oil, and provided with rigid side walls and rigid base walls to which the support structures 301, 303 are attached. Rigid walls may be provided by steel plate, for example. The flexible diaphragm 403, 413 is made of a material that is resistant to corrosion when exposed to the fluid being tested, which may be a corrosive fluid, for example, an acid or fuel. By way of example, the flexible diaphragm 403, 413 may be constructed with stainless steel or titanium which provides corrosion resistance in the presence of most fluids. The outer sides of the flexible diaphragms 403, 413 define a wall of a port 705, 707 which received the first and second fluids whose pressures are being measured. The ports have side walls 709, 711 which are formed from a corrosion resistant material. An external thread 703 is defined on an outer wall of port 705, 707 which allow the attachment of a threaded fitting for connecting to a conduit carrying the fluid being measured. The side walls 709, 711 of the first and second ports 705, 707 further define a channel to receive an O-ring 701. The O-ring 701 forms a fluid-tight seal between the port 705, 707 and the fitting that is threaded onto the port 705, 707.

A first fluid enters port 705 and exerts a force due to pressure against the flexible diaphragm 403. The flexible diaphragm 403 flexes and transmits the force applied against it to the oil within, such as in the oil-filled volume 717. The pressure is transmitted throughout the oil in the oil-filled volume 717, including in the region defined by the aperture in first support structure 301 and the upper surface of the diaphragm of semiconductor pressure sensing die 310. A second fluid enters port 707 and exerts a force due to pressure against flexible diaphragm 413. The flexible diaphragm 413 flexes and transmits the force applied against it to the oil within oil-filled volume 727. The pressure is transmitted throughout the oil in oil-filled volume 727 including the region defined by the aperture in second support structure 303 and the lower surface of the diaphragm of semiconductor pressure sensing die 310.

A printed circuit board (PCB) 419 is electrically connected to the semiconductor pressure sensing die 310 by bond wires 721. The PCB circuitry 419 is further electrically connected to electrical contact pin 714 which provides an electrical signal representative of a measured differential pressure value to external systems outside the differential pressure sensor 700.

The contact points at which the port side walls 709, 711, the flexible diaphragms 403, 413 and the oil-filled volumes 717, 727 may be connected by welds 719 to produce the differential pressure sensor 700.

While the embodiment of the package shown in FIGS. 5A, 5B, 6A, 6B, 6C and 7 are used to house an oil-filled differential pressure sensor which isolates the fluids being tested from the differential pressure sensor die 300, this is shown by way of example only. Other configurations and used may be contemplated by one of skill in the art. For example, the housing 602 of the package may be formed from a plastic which is resistant to corrosion from some non-corrosive or semi-corrosive fluids. In this embodiment, the package may house a differential pressure sensor that comprises only the differential pressure sensing die 300 without the oil-filled volumes. In this embodiment, the fluid being tested is allowed to enter the differential pressure die 300 through apertures in the first and second support structures 307, 309, showing FIG. 3A, which are accessible directly through fluid ports 501, 503. An exemplary embodiment of this configuration is described in detail with respect to FIG. 8 below.

Figure 8A:
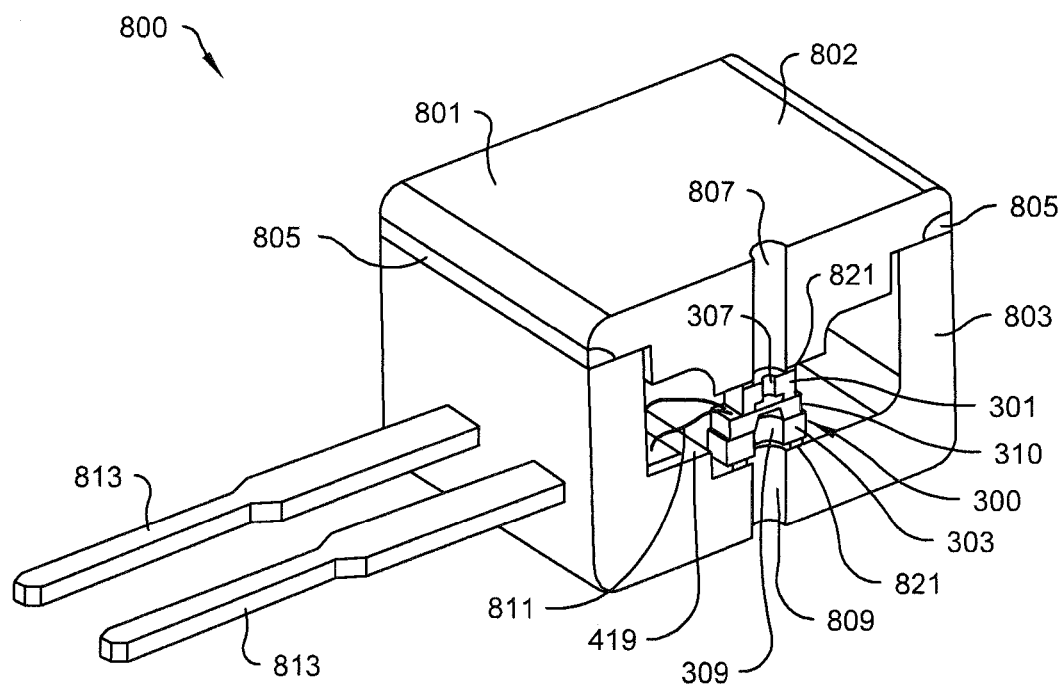
FIG. 8A is a partial section perspective view of a non-isolated differential pressure sensor according to an embodiment of the disclosure.

FIG. 8A is an isometric partial cross sectional view of a package 800 for a differential pressure sensing die, with a differential pressure sensing die 300 shown mounted therein, according to an embodiment of the disclosure. Package 800 is configured to receive a differential pressure sensing die for measuring differential pressure of a semi-corrosive or non-corrosive fluid. Package 800 includes a housing 802. In the illustrative embodiment, the housing 802 has two members. In the illustrated embodiment, a lower housing member 803 includes a base and an upright circumferential wall around the base. Upper housing member 801 acts a lid or seal when placed on the lower member 803, and particularly on a top rim of the circumferential wall of lower member 803. A gasket or adhesive seal 805 is disposed between the upper member 801 and the lower member 803. Seal 805 seals the interior of the housing from outside contaminants. Two ports 807, 809 are defined through opposing sides of the housing. In the illustrated embodiment, the ports are defined through upper member 801 and the base of lower member 803, respectively, but may be defined through other portions of the housing. Port 809 is positioned so that its inner opening is suitable for alignment with, and a fluid-impervious seal with, an aperture of a differential pressure sensing die, such as aperture 309 of differential pressure sensing die 300. Similarly, port 807 is positioned so that its inner opening is suitable for alignment with, and a fluid-impervious seal with, an other aperture of a differential pressure sensing die, such as aperture 307 of differential pressure sensing die 300. Thus, fluid communication is established via ports 807, 809 to opposing sides of a diaphragm of differential pressure sensing die 300. Because the differential pressure sensor package 800 is designed to measure the differential pressure of a non-corrosive or semi-corrosive fluid, the semiconductor pressure die 310 and support structures 301, 303 are not isolated from the fluids being tested. However, as a result of the seals between ports 807, 809 and apertures 307, 309, respectively, the interior volume of housing 802 is isolated from the fluids being tested. Housing 802 further isolates the interior volume from the external environment.

Package 800 further includes electrical connection pins 813 extending from an outer wall of housing 802. Electrically connection pins 813 are in electrical communication through the wall of housing 802 to contacts interior to housing 802. In embodiments, the contacts may be in electrical communication with an ASIC and possibly a PCB having circuitry 419. PCB circuitry 419 and ASIC of package 800 may be configured to communicate with piezoelectric elements of a semiconductor pressure die and to output differential pressure data. Semiconductor pressure die 310 includes electrical contact points where the semiconductor pressure die 310 is connected to bonding wires 811. The bonding wires 811 electrically connect the semiconductor pressure die 310 to PCB circuitry 419. The PCB circuitry 419 may include a microprocessor and memory in communication with the microprocessor for determining a differential pressure value based on electrical signals received from the semiconductor pressure die 310. Electrical connection pins 813 extend through the wall of housing and are electrically connected to the PCB circuitry 419. The carry electrical signals relating to the measured differential pressure between the first and second fluids to external systems. As shown in FIG. 8A, the electrical connection pins 813 may be arranged as a single in-line package (SIP) having a single row of contact pins. This configuration is provided solely by way of example and other configurations could be used. For example, a dual in-line package (DIP) could be used or the differential pressure sensor package 800 could be configured as a surface mounted housing having a port for receiving an adapter connected to a wiring housing. The external systems may relate to controls or indicator systems which may use the differential pressure measurement value to determine an abnormal condition and send a warning signal, or the external system may be, by way of example, a valve control which operates a valve based on a differential pressure measured between a point upstream and a point downstream from the valve. In an exemplary application using an embodiment of the differential pressure sensor package 800, a first fluid is oil in a vehicle engine prior to the oil entering the vehicle's oil filter. The second fluid is the vehicle engine oil after the oil has passed through the oil filter. The differential pressure of the engine oil prior to entering the filter, and subsequent to leaving the filter, may provide an indication of the condition of the oil filter. If it is determined that the flow in the oil filter has become restricted, a warning may be provided to the vehicle operator indicating that maintenance is required, or that the oil filter should be replaced.

A first fluid is introduced through port 807 via a suitable fitting (not shown). The first fluid enters port 807 which is aligned with the aperture 307 which passes through the cross sectional length of first support structure or constraint 301. The first fluid flows through the first support structure 301 and comes into fluid contact with the upper surface of the diaphragm of semiconductor pressure die 310.

A second fluid is introduced to port 809 via a suitable fitting (not shown). the second fluid passes through port 809 which is aligned with an aperture 309 which passes through the cross sectional length of second support or constraint 303. The fluid passes through the second support structure 303 and comes into contact through fluid communication with the lower side of the diaphragm defined in semiconductor pressure die 310. As the first and second fluids apply their respective pressures against opposing surfaces of the diaphragm, piezo-resistive elements on the surface of the semiconductor diaphragm produce an electrical resistance which correlates to the amount of differential pressure being applied to the piezo-resistive elements. An electrical current flowing through the piezo-resistive elements is proportional to the resistance generated by the pressure differential and produces a current measurement value that may be used to derive the differential pressure value between the pressures of the first fluid and the second fluid.

FIG. 8A shows a differential pressure sensor in which the first port 807 is disposed in the upper member 801 of the housing, while the second port 809 is disposed in the underside of the lower member 803 of the housing. This configuration is provided merely by way of example. Other configurations may be used. For example, the first port 807 may be defined in a side wall of lower member 803 of the housing. The second port 809 may be defined in a side wall of the lower member 803, opposite the first port 807, or alternatively, the second port 809 may be defined in a side wall adjacent to the side wall containing first port 807.

According to an embodiment of differential pressure sensor package 800, housing members 801, 803 are fabricated from plastic. The plastic may be molded to form apertures defining ports 807, 809. The plastic is selected to provide corrosion resistance from the fluid being tested via ports 807, 809. In this manner, the fluid being tested may be introduced directly to ports 807, 809. The fluid enters the port 807, 809 and fills the volume defined by the openings in the first support structure 301 and the second support structure 303. The fluid is thus in fluid communication with the upper and lower side of the diaphragm 313 defined in the semiconductor pressure sensing die 310. The differential pressure sensing die 300 (shown in FIG. 3A) may be installed in the package defined by housing members 801, 803, such that ports 807, 809 are aligned with apertures 307, 309 in the differential pressure sensing die 300. The plastic package may be attached to the differential pressure sensing die by an appropriate adhesive which provides a fluid-tight seal 821 between the housing members 801, 803 and the support structures 301, 303 of the die. Alternatively, the plastic package may be molded having an interior volume defined, such as through internal walls or ribs, which has a profile that corresponds to the profile of the differential pressure sensing die 300. For example, the interior volume may be defined in the lower housing member 803 of the package. The die is placed into the interior volume with the apertures 307, 309 in the die aligned with the ports 807, 809 in the package. The upper housing member 801 is mated to the lower housing member 803 to define a fluid-tight package.

Figure 8B:
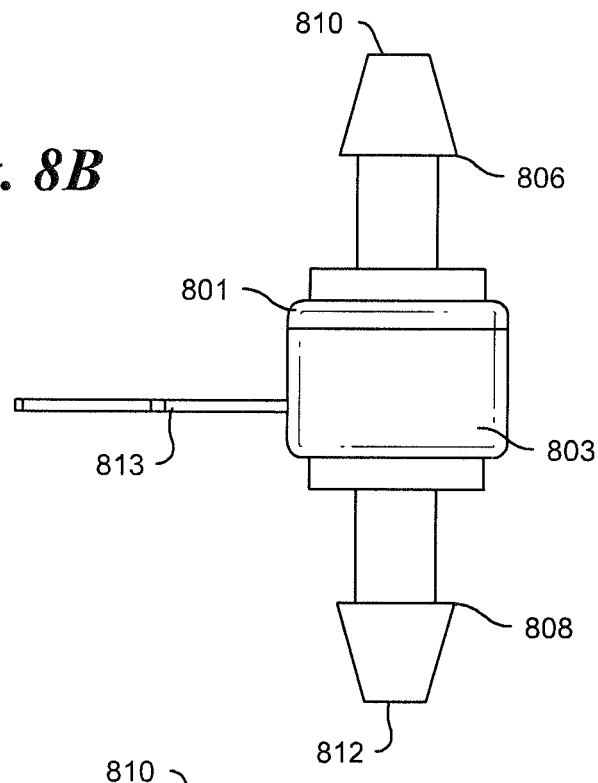
FIG. 8B is an elevation view of a non-isolated differential pressure sensor and housing according to an embodiment of the disclosure.
Figure 8C:
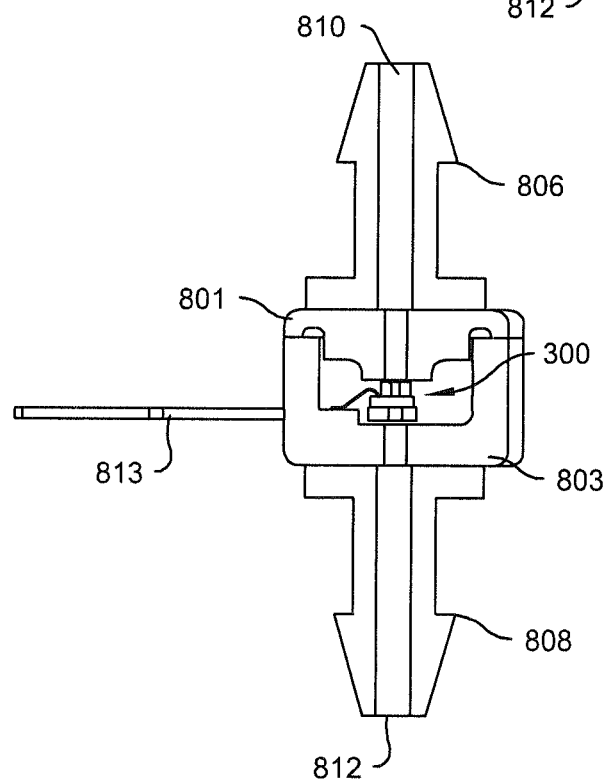
FIG. 8C is a sectional view of the non-isolated differential pressure sensor of FIG. 8B.

FIG. 8B and FIG. 8C show an elevation and sectional view, respectively, of an embodiment of a non oil-filled differential pressure sensor embodiment within a molded package 800. A first fluid port 810 and a second fluid port 812 enter the package and are in fluid contact with opposing ends of differential pressure sensing die 300. The housing has an upper member 801 and a lower member 803 which may be sealed by a gasket or adhesive seal 805. Fluid ports 810, 812 are barbed to allow a hose to fit over the fluid port and be held in place and sealed by barb 806, 808 or by the addition of a ring clamp to secure the hose or tubing to fluid port 810, 812. Electrical signals, including signals representative of a differential pressure of fluids between the first fluid port 810 and the second fluid port 812 may be transmitted or carried via electrical contact 813.

Figure 9:
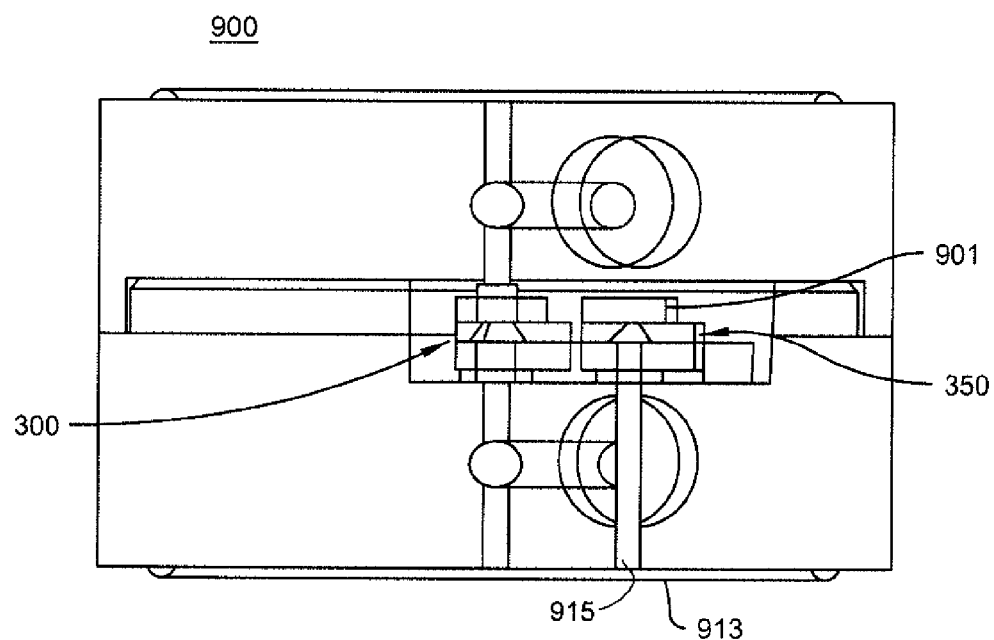
FIG. 9 is a ghost view of an isolated oil-filled pressure sensor which includes two dies, a first differential pressure sensing die and an absolute pressure sensing die according to an embodiment of the disclosure.

FIG. 9 is a cross sectional elevation view of an isolated oil-filled pressure sensor that is configured with a differential pressure sensor and an absolute pressure sensor. The sensor housing is similar to the oil-filled embodiment of a differential pressure sensor as shown in FIG. 4A and FIG. 4B. In the pressure sensor 900 of FIG. 9, however, an additional absolute pressure sensing die 350 is added. Absolute pressure sensing die 350 is configured with a semiconductor pressure sensing die, similar to differential pressure sensing die 300. However, the upper constraint 901 of the absolute pressure sensing die 350 does not have an aperture which allows fluid to enter the upper constraint 901 and come in fluid contact with the semiconductor die. Instead, upper constraint 901 is a sealed glass constraint which may have an internal volume maintained as a vacuum. In this way, fluid which comes in fluid contact with the flexible metal diaphragm 913 of sensor 900 will have its pressure transmitted through the oil-filled volume 915 to the lower side of absolute pressure sensing die 350. Thus, the sensed pressure is a factor of only the pressure exerted from the lower diaphragm 913 compared to reference pressure, such as a vacuum. The pressure sensor 900 in FIG. 9 can thus be used as either a differential pressure sensor or an absolute pressure sensor, or both. The differential pressure signal could be distinguished from the absolute pressure signal by identifying the pressure sensing die 300, 350 from which the signal was generated.

While the foregoing invention has been described with reference to the above-described embodiment, various modifications and changes can be made without departing from the spirit of the invention. Accordingly, all such modifications and changes are considered to be within the scope of the appended claims. Accordingly, the specification and the drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations of variations of various embodiments. Combinations of the above embodiments, and other embodiments not specifically described herein, will be apparent to those of skill in the art upon reviewing the above description.

What is claimed is:

1. A package for receiving a differential pressure sensing die, the differential pressure sensing die comprising a semiconductor die having an integral diaphragm adapted to measure a differential pressure applied to opposing sides of the integral diaphragm, the package comprising:
   a first housing member configured to receive the differential pressure sensing die, the first housing member defining a chamber and supporting a first flexible diaphragm that divides the chamber into a first internal volume and a first fluid-fillable volume, the first fluid-fillable volume in fluid communication with a first side of the integral diaphragm of the differential pressure sensing die when the differential pressure sensing die is installed in the package;
   at least one second housing member, the at least one second housing member defining a second chamber and supporting a second flexible diaphragm that divides the second chamber into a second internal volume and a second fluid-fillable volume, the second fluid-fillable volume in fluid communication with a second side of the integral diaphragm of the differential pressure sensing die when the differential pressure sensing die is installed in the package, wherein the first housing member and the at least one second housing member are configured to mate with one another to define a housing, the housing defining a first central portion in which the first housing member and the second housing member directly contact one another and a second central portion defining a third internal volume for receiving the differential pressure sensing die, the first housing member having a first internal port defined in a wall of the first housing member at the second central portion and the second housing member having a second internal port defined in a wall of the second housing member at the second central portion, the internal ports being arranged to mate with the pressure sensing die, the respective walls attached directly to the differential pressure sensing die when the differential pressure sensing die is received by the third internal volume, and wherein the first housing member supports the first flexible diaphragm and the second housing member supports the second flexible diaphragm independent of the first housing member when the first housing member and the second housing member are not mated;
   a first port defined through a first wall of the first housing member, the first port in fluid communication with the first internal volume; and
   a second port defined through a second wall of one of the at least one second housing members, the second port in fluid communication with the second internal volume, wherein the first port is configured to receive a first fluid at a first pressure and the second port is configured to receive a second fluid at a second pressure.

2. The package of claim 1, where in the first housing member and the at least one second housing members comprise a plastic.

3. The package of claim 1, further comprising:
   at least one electrical connection pin extending outward from the package, electrically connected to an electrical conductor through the housing, for connection to a bond wire in electrical communication with a piezoresistive element formed in a surface of the integral diaphragm, wherein the package is configured to maintain the electrical connection pin physically isolated from contact with the first fluid introduced at the first port or the second fluid introduced at the second port.

4. The package of claim 3, wherein the at least one electrical connection pin is configured as a single inline package (SIP).

5. The package of claim 3, wherein the at least one electrical connection pin is configured as a dual inline package (DIP).

6. The package of claim 1, further comprising:
   a first fitting, configured to be threadingly engaged to an external thread defined on the first port;
   a first O-ring, disposed between the first fitting and the first port defined in the first housing member;
   a second fitting, configured to be threadingly engaged to an external thread defined on the second port; and
   a second O-ring, disposed between the second fitting and the second port defined in one of the at least one second housing members.

7. The package of claim 1, further comprising:
   at least one flanged portion integrally formed with at least one of the first housing member and one of the at least one second housing members and having a hole defined therein for receiving a fastener for surface mounting the package.

8. The package of claim 7, wherein the at least one flanged portion is configured to permit surface mounting of the package on a frame of a vehicle.

9. The package of claim 1, wherein the first port is configured to be connected to an inlet of an oil filter of a vehicle.

10. The package of claim 9, wherein the second port is configured to be connected to an outlet of the oil filter.

11. A package for receiving a differential pressure sensing die, the differential pressure sensing die comprising a semiconductor die having an integral diaphragm adapted to measure a differential pressure applied to opposing sides of the integral diaphragm, the package comprising:
   a housing, defined by a plurality of housing members, a first housing member of the plurality of housing members defining a first internal volume and a first fluid-fillable volume separated by a first flexible diaphragm supported by the first housing member and a second housing member of the plurality of housing members defining a second internal volume and a second fluid-fillable volume separated by a second flexible diaphragm supported by the second housing member, the housing defining a first central portion in which the first housing member and the second housing member directly contact one another and a second central portion defining a third internal volume between the first fluid-fillable volume and the second fluid-fillable volume configured to support and receive the differential pressure sensing die when the first housing member is mated with the second housing member, the first housing member having a first internal port defined in a wall of the first housing member at the second central portion and the second housing member having a second internal port defined in a wall of the second housing member at the second central portion, the internal ports being arranged to mate with the differential pressure sensing die, the respective walls attached directly to the differential pressure sensing die when the differential pressure sensing die is received by the third internal volume, and wherein the first housing member supports the first flexible diaphragm and the second housing member supports the second flexible diaphragm independent of the first housing member when the first housing member and the second housing member are not mated;

a first port defined through a first wall of the first housing member, the first port in fluid communication with the first internal volume;

a second port defined through a second wall of the second housing member, the second port in fluid communication with the second internal volume; and at least one electrical connection pin extending outward from the housing, and in electrical communication through a wall of the third internal volume for connection to a bond wire in electrical communication with a piezo-resistive element formed in a surface of the integral diaphragm.

12. The package of claim 11, wherein the package is configured to maintain the electrical connection pin physically isolated from contact with a fluid introduced at either the first port or the second port.

13. The package of claim 11, wherein the at least one electrical connection pin is configured as a single inline package (SIP).

14. The package of claim 11, wherein the at least one electrical connection pin is configured as a dual inline package (DIP).

15. The package of claim 11, further comprising:
a first fitting, configured to be threadingly engaged to an external thread defined on the first port;
a first O-ring, disposed between the first fitting and the first port;
a second fitting, configured to be threadingly engaged to an external thread defined on the second port; and
a second O-ring, disposed between the second fitting and the second port.

16. The package of claim 11, further comprising:
at least one flanged portion rigidly attached to one of the housing members and having a hole defined therein for receiving a fastener for surface mounting the package.

17. The package of claim 16, wherein the at least one flanged portion is configured to permit surface mounting of the package on a frame of a vehicle.

18. The package of claim 11, wherein the first port is configured to be connected to an inlet of an oil filter of a vehicle, to permit fluid communication from the inlet to a side of the first flexible diaphragm.

19. The package of claim 18, wherein the second port is configured to be connected to an outlet of the oil filter, to permit fluid communication from the outlet to an opposite side of the second flexible diaphragm.

20. A package for receiving a differential pressure sensing die, the differential pressure sensing die comprising a semiconductor die having an integral diaphragm adapted to measure a differential pressure applied to opposing sides of the integral diaphragm, the package comprising:
a first housing member configured to receive the differential pressure sensing die;
at least one second housing member, the first housing member and the at least one second housing member configured to mate with one another to define a housing, the housing having defined therein an interior volume for containing said differential pressure sensing die;
a first port defined through a wall of said first housing member, said first port positioned to be aligned with an aperture defined in a first side of said differential pressure sensing die when said differential pressure sensing die is contained in said first housing member; and
a second port defined through a wall of said second housing member, said second port positioned to be aligned with a second aperture defined in a second side of said differential pressure sensing die, opposite said first side, when said first housing member is mated with said second housing member; and
wherein the first housing member and the second housing member are mated and form a longitudinal axis and the differential pressure sensing die is insertable into the package between the first housing member and the second housing member when the first housing member and the second housing member are mated, the differential pressure sensing die configured to be inserted into the package from a side of the package, perpendicular to the longitudinal axis.

21. The package of claim 20,
wherein the first housing member defines a first chamber and supports a first flexible diaphragm that divides the first chamber into a first internal volume and a first fluid-fillable volume, the first fluid-fillable volume in fluid communication with a first side of the integral diaphragm of the differential pressure sensing die when the differential pressure sensing die is installed in the package, and wherein the second housing member defines a second chamber and supports a second flexible diaphragm that divides the second chamber into a second internal volume and a second fluid-fillable volume, the second fluid-fillable volume in fluid communication with a second side of the integral diaphragm of the differential pressure sensing die when the differential pressure sensing die is installed in the package, and wherein the interior volume defined when the first housing member and the second housing member are mated is between the first fluid-fillable volume and the second fluid-fillable volume the interior volume for receiving the differential pressure sensing die, and wherein the first housing member and the second housing member are arranged to each be bonded directly to the differential pressure sensing die when the differential pressure sensing die is received by the interior volume, and wherein the first housing member supports the first flexible diaphragm and the second housing member supports the second flexible diaphragm independent of the first housing member when the first housing member and the second housing member are not mated.

* * * * *